(12) United States Patent
Yang et al.

(10) Patent No.: US 7,381,609 B2
(45) Date of Patent: Jun. 3, 2008

(54) METHOD AND STRUCTURE FOR CONTROLLING STRESS IN A TRANSISTOR CHANNEL

(75) Inventors: Haining S. Yang, Wappingers Falls, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,841

(22) Filed: Jan. 16, 2004

(65) Prior Publication Data

US 2005/0158937 A1 Jul. 21, 2005

(51) Int. Cl.
*H01L 21/8238* (2006.01)
(52) U.S. Cl. .................................... 438/218; 438/286
(58) Field of Classification Search ............... 438/218, 438/286
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |

(Continued)

FOREIGN PATENT DOCUMENTS

JP 64-76755 3/1989

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.
Kern Rim, et al., "Characteristics and Device Design of Sub-100 nm Strained Si N- and PMOSFETs", 2002 Symposium On VLSI Technology Digest of Technical Papers, IEEE, pp. 98-99.

(Continued)

*Primary Examiner*—Jack Chen
(74) *Attorney, Agent, or Firm*—Joseph P. Abate; Greenblum & Bernstein, P.L.C.

(57) ABSTRACT

A method for manufacturing a device including an n-type device and a p-type device. In an aspect of the invention, the method involves forming a shallow-trench-isolation oxide (STI) isolating the n-type device from the p-type device. The method further involves adjusting the shallow-trench-isolation oxide corresponding to at least one of the n-type device and the p-type device such that a thickness of the shallow-trench-isolation oxide adjacent to the n-type device is different from a thickness of the shallow-trench-isolation oxide adjacent to the p-type device, and forming a strain layer over the semiconductor substrate.

18 Claims, 9 Drawing Sheets

U.S. PATENT DOCUMENTS

| | | | |
|---|---|---|---|
| 5,592,007 | A | 1/1997 | Leedy |
| 5,592,018 | A | 1/1997 | Leedy |
| 5,670,798 | A | 9/1997 | Schetzina |
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B2 | 11/2002 | Shimizu et al. |
| 6,483,171 | B1 | 11/2002 | Forbes et al. |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B2 | 1/2003 | Jan et al. |
| 6,509,618 | B2 | 1/2003 | Jan et al. |
| 6,521,964 | B1 | 2/2003 | Jan et al. |
| 6,531,369 | B1 | 3/2003 | Ozkan et al. |
| 6,531,740 | B2 | 3/2003 | Bosco et al. |
| 6,717,216 | B1 | 4/2004 | Doris et al. |
| 6,825,529 | B2 | 11/2004 | Chidambarrao et al. |
| 6,831,292 | B2 | 12/2004 | Currie et al. |
| 6,974,981 | B2 | 12/2005 | Chidambarrao et al. |
| 6,977,194 | B2 | 12/2005 | Belyansky et al. |
| 7,015,082 | B2 | 3/2006 | Doris et al. |
| 2001/0009784 | A1 | 7/2001 | Ma et al. |
| 2002/0063292 | A1 | 5/2002 | Armstrong et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0238914 | A1 | 12/2004 | Deshpande et al. |
| 2004/0262784 | A1 | 12/2004 | Doris et al. |
| 2005/0040460 | A1 | 2/2005 | Chidambarrao et al. |
| 2005/0082634 | A1 | 4/2005 | Doris et al. |
| 2005/0093030 | A1 | 5/2005 | Doris et al. |
| 2005/0098829 | A1 | 5/2005 | Doris et al. |
| 2005/0106799 | A1 | 5/2005 | Doris et al. |
| 2005/0145954 | A1 | 7/2005 | Zhu et al. |
| 2005/0148146 | A1 | 7/2005 | Doris et al. |
| 2005/0194699 | A1 | 9/2005 | Belyansky et al. |
| 2005/0236668 | A1 | 10/2005 | Zhu et al. |
| 2005/0245017 | A1 | 11/2005 | Belyansky et al. |
| 2005/0280051 | A1 | 12/2005 | Chidambarrao et al. |
| 2005/0282325 | A1 | 12/2005 | Belyansky et al. |
| 2006/0027868 | A1 | 2/2006 | Doris et al. |
| 2006/0057787 | A1 | 3/2006 | Doris et al. |
| 2006/0060925 | A1 | 3/2006 | Doris et al. |
| 2006/0281245 | A1* | 12/2006 | Okuno et al. ............... 438/221 |

OTHER PUBLICATIONS

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

* cited by examiner

Stress Sxx vs. hight of STI-oxide
In Si cut at y= +0.01um and In film y= -0.01um
Pressure (dynes/cm*2)

Distance (microns)

METHOD AND STRUCTURE FOR CONTROLLING STRESS IN A TRANSISTOR CHANNEL

BACKGROUND OF INVENTION

The invention generally relates to methods for manufacturing a semiconductor device with improved device performance, and more particularly to methods for manufacturing semiconductor devices which impose tensile and compressive stresses in the substrate of the device during device fabrication.

Generally, metal-oxide semiconductor transistors include a substrate made of a semiconductor material, such as silicon. The transistors typically include a source region, a channel region and a drain region within the substrate. The channel region is located between the source and the drain regions. A gate stack, which usually includes a conductive material, a gate oxide layer and sidewall spacers, is generally provided above the channel region. More particularly, the gate oxide layer is typically provided on the substrate over the channel region, while the gate conductor is usually provided above the gate oxide layer. The sidewall spacers help protect the sidewalls of the gate conductor.

It is known that the amount of current flowing through a channel which has a given electric field across it, is generally directly proportional to the mobility of the carriers in the channel. Thus, by increasing the mobility of the carriers in the channel, the operation speed of the transistor can be increased.

It is further known that mechanical stresses within a semiconductor device substrate can modulate device performance by, for example, increasing the mobility of the carriers in the semiconductor device. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, for example tensile stress or compressive stress, improves the device characteristics of one type of device (i.e., n-type device or p-type device) while discriminatively affecting the characteristics of the other type device.

In order to maximize the performance of both NFETs and PFETs within integrated circuit (IC) devices, the stress components should be engineered and applied differently for NFETs and PFETs. That is, because the type of stress which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contains a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal directions.

SUMMARY OF INVENTION

In a first aspect of the invention, the invention provides a method for manufacturing a device including an n-type device and a p-type device. The method involves forming a shallow-trench-isolation oxide (STI) isolating the n-type device from the p-type device and adjusting the shallow-trench-isolation oxide corresponding to at least one of the n-type device and the p-type device such that a thickness of the shallow-trench-isolation oxide adjacent to the n-type device is different from a thickness of the shallow-trench-isolation oxide adjacent to the p-type device. The method further involves forming a strain layer over the semiconductor substrate.

In another aspect of the invention, the invention provides a method for manufacturing a device including an n-type device and a p-type device. The method involves forming a boundary for the n-type device and the p-type device and adjusting a height of the boundary such that the boundary adjacent to the n-type device is at a level which is different from a level of the boundary adjacent to the p-type device. The method further involves forming a strain layer over the semiconductor substrate.

In another aspect of the invention, the invention provides a semiconductor device having a strain layer formed over n-type transistors and p-type transistors formed on a silicon substrate. The device further includes a shallow-trench-isolation oxide around each of the n-type transistors and the p-type transistors, wherein an upper surface of the shallow-trench-isolation oxide of the n-type transistors is at a level than an upper surface of the shallow-trench-isolation oxide of the p-type transistors.

DETAILED DESCRIPTION

The invention provides a method for fabricating devices with improved performance characteristics. Tensile and/or compressive stresses can be provided in the channel of a transistor depending on the proximity of the grown stress/strain layer to the channel of the transistor. In an aspect of this invention, by selectively adjusting the topography of the shallow-trench-isolation oxide, which generally surrounds the transistor, tensile stresses can be provided in the channel of NFETs and compressive stresses can be provided in the channel of PFETs such that the performance of both the NFETs and the PFETs can be improved using the same stress/strain layer.

In this invention, a stress layer, such as a SiGe layer, for example, is used to form stresses in a channel of the semiconductor device. When a SiGe layer is grown on a semiconductor layer the surrounding semiconductor material is subjected to tensile stress while the grown SiGe layer is subjected to compressive stress. In particular, a portion of the semiconductor device is put under tensile stress and the SiGe layer is subjected to compressive stress because the SiGe layer has a different lattice structure than the silicon layer. Further, the stress levels resulting from the SiGe stress layer are relatively high (on the order of 1-2 GPa).

However, as discussed above, tensile stresses in the channel area are beneficial to the NFET drive currents while compressive stresses in the channel area are beneficial to the PFET drive currents. In particular, tensile stresses significantly hinder the PFET drive currents. In this invention, the stresses in the PFET are made to be compressive stresses rather than tensile stresses in order to improve the performance of the PFET. Thus, this invention provides a method for preventing the formation of tensile stresses and/or providing longitudinal compressive stresses along the channel of the PFET while providing tensile stresses along the channel of the NFET to improve the performance of the devices.

Figure 1:
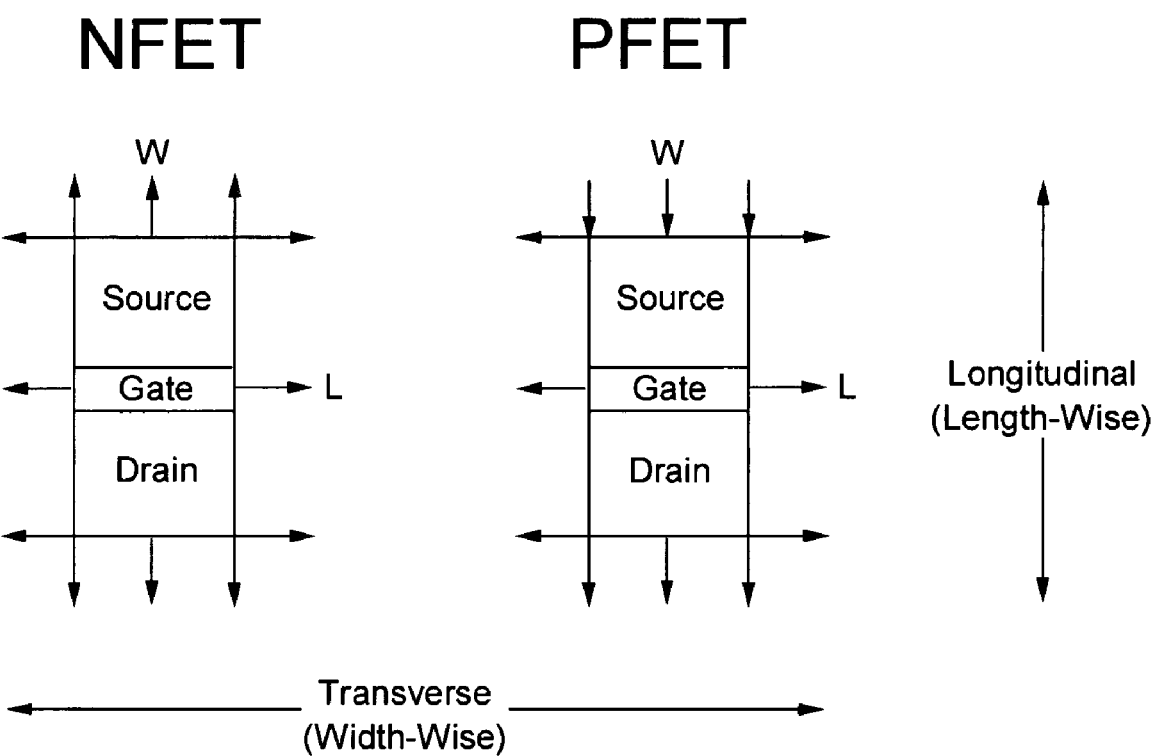
FIG. 1 illustrates desired stress states for PFETs and NFETs.

FIG. 1 illustrates desired stress states for improving the performance of PFETs and NFETs (see Wang et al., IEEE Tran. Electron Dev., v. 50, p. 529, 2003). In FIG. 1, an NFET and a PFET are shown to have a source region, a gate region and a drain region. The NFET and PFET are shown to have arrows extending outward from the active area to illustrate tensile stresses. The arrows extending inward toward the PFET device are illustrative of compressive forces. More specifically, the outwardly extending arrows, shown extending from the NFET, illustrate a tensile stress that is desired in the transverse and longitudinal directions of the device. On the other hand, the inwardly extending arrows, shown with relation to the PFET, illustrate a desired longitudinal compressive stress.

The range of stresses needed to influence device drive currents is of the order of a few hundred MPa to a few GPa. The width and the length of the active area of each device are represented by "W" and "L", respectively. It should be understood that each of the longitudinal or transverse stress components could be individually tailored to provide the performance enhancements for both devices (i.e., the NFET and the PFET).

Figure 2:
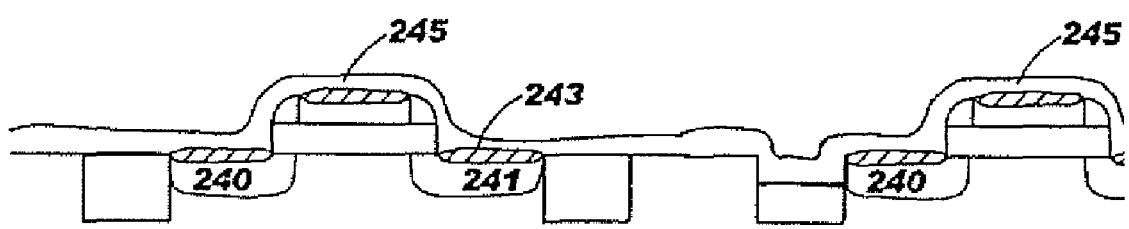
FIGS. 2 through 2(*l*) illustrate an exemplary process for forming a transistor according to the invention.
Figure 2A:
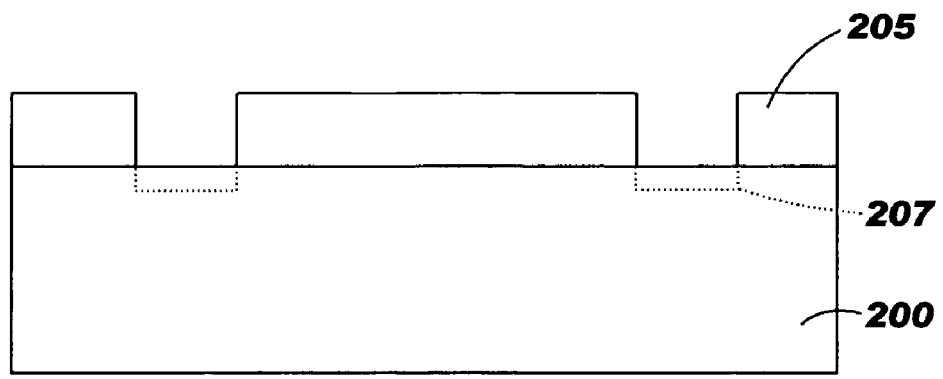

FIGS. 2(a) through 2(l) depict an exemplary process for forming n-type devices according to this invention. As shown in FIG. 2(a), a patterned photo-resist layer 205 is deposited over a silicon substrate 200 and the exposed portion of the silicon substrate 200 is doped, for example, with Ge, As, B, In or Sb. For example, the doping concentration of Ge may be, for example, about $1\times10^{14}$ Ge/cm2 to about $1\times10^{16}$ Ge/cm2. A doped region 207 is formed in the semiconductor substrate 200.

Then, as shown in FIG. 2(a), the patterned photo-resist layer 205 is removed and a mask 210, made of nitride, for example, is deposited on the surface of the semiconductor substrate 200. The mask 210 protects the semiconductor substrate beneath it from being etched during reactive ion etching (RIE). Generally, the mask 210 exposes portions of the semiconductor substrate where shallow trenches are to be formed via RIE.

Figure 2B:
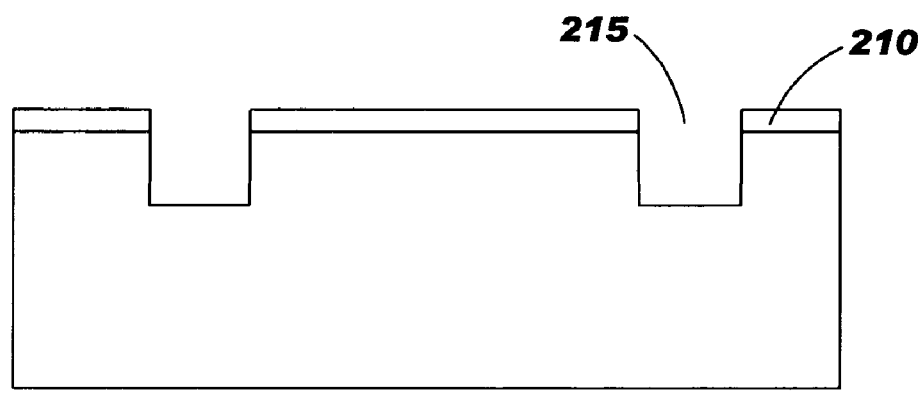

As shown in FIG. 2(b), RIE is performed to form grooves/trenches 215 in the semiconductor substrate 200. In particular, the location of the formed grooves/trenches at least partially overlaps a portion of the doped semiconductor region 207 such that when the grooves/trenches 215 are formed, the doped semiconductor substrate region is exposed. Oxide material is then deposited to fill the trenches, such that devices adjacent to each other on the semiconductor substrate 200 are electrically isolated from each other.

Figure 2C:
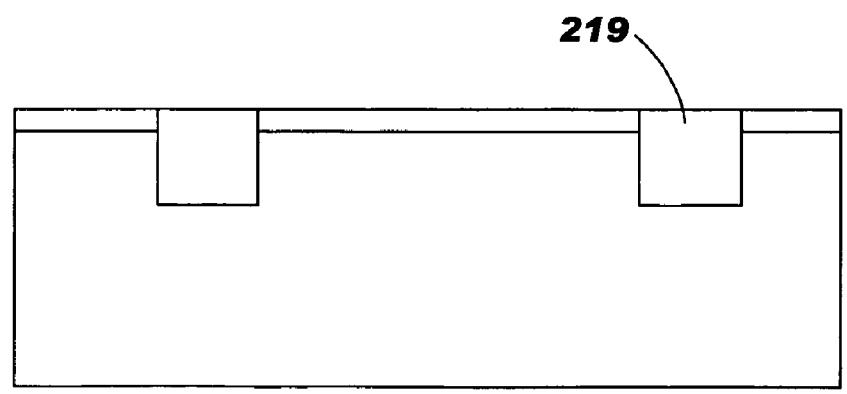
Figure 2D:
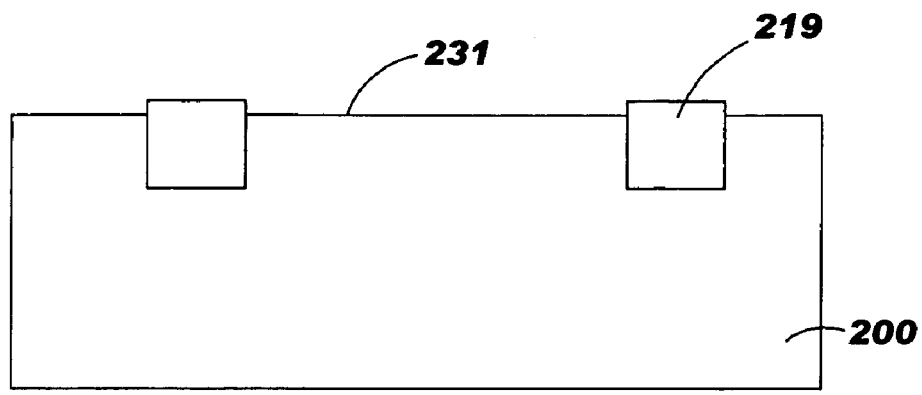

As shown in FIG. 2(c), oxide material 219 is then deposited to fill the trenches and electrically isolate the device from any adjacent device. After filling the trenches with the oxide material, the mask 210 is removed using any known appropriate method, leaving the oxide material 219 to protrude above the surface of the semiconductor substrate 200. Accordingly, the amount of oxide material 219 protruding above the surface of the semiconductor material 200 may be controlled by controlling the thickness of the mask 210. After the mask 210 is removed, as shown in FIG. 2(d), chemical mechanical polishing (CMP) is performed to substantially planarize the upper surface 231 of the semiconductor substrate 200.

Figure 2E:
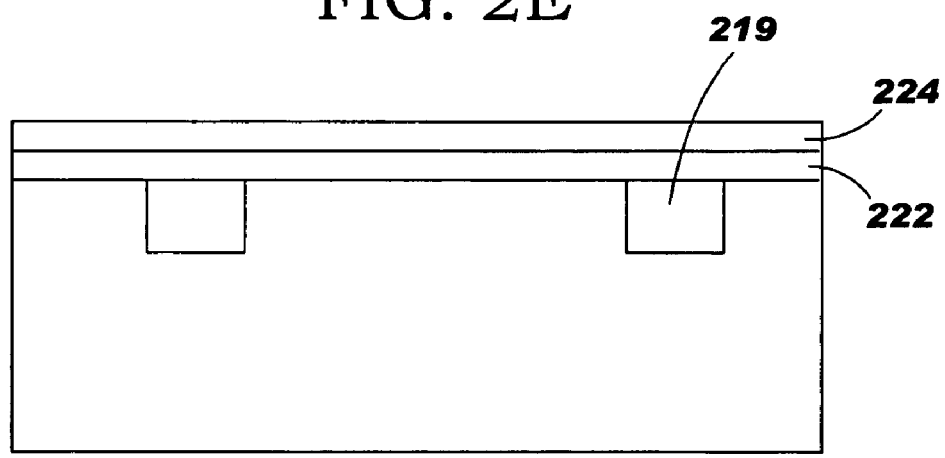
Figure 2F:
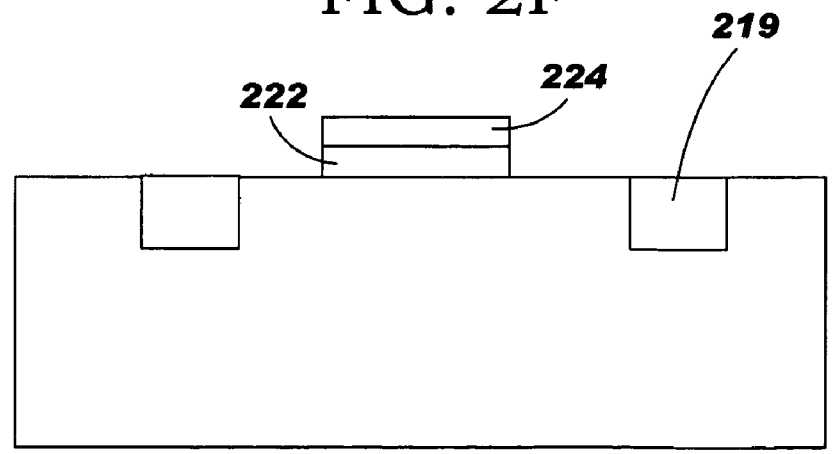

Next, as shown in FIG. 2(e), the semiconductor device is further fabricated using known methods. For example, as shown in FIG. 2(e), a gate oxide layer 222 is grown on the upper surface 231 of the semiconductor substrate 200. A gate oxide layer 222 of about 10 Angstoms to about 100 Å is generally grown. On the gate oxide layer 222, a polysilicon layer 224 is generally deposited using chemical vapor deposition (CVD) to a thickness of about 500 Angstoms to about 1500 Angstoms to form the gate electrode 232 (see FIG. 2(f)).

Patterned photoresist layers (not shown) are then used to define the gate electrodes. A thin layer of oxide (not shown) is then grown on the remaining polysilicon. Patterned photoresist layers (not shown), which are later removed, are used to successively tip (and halo counter dope) implant the n-type and p-type transistors. For n-type transistors, a very shallow and low dose implant of arsenic ions, for example, may be used to form the p-tip (while a Boron implant, for example, may be used for halos). For p-type transistors, a very shallow and low dose implant of $BF_2$ ions, for example, may be used to form n-tip (while an arsenic implant may, for example, be used for halos).

Figure 2G:
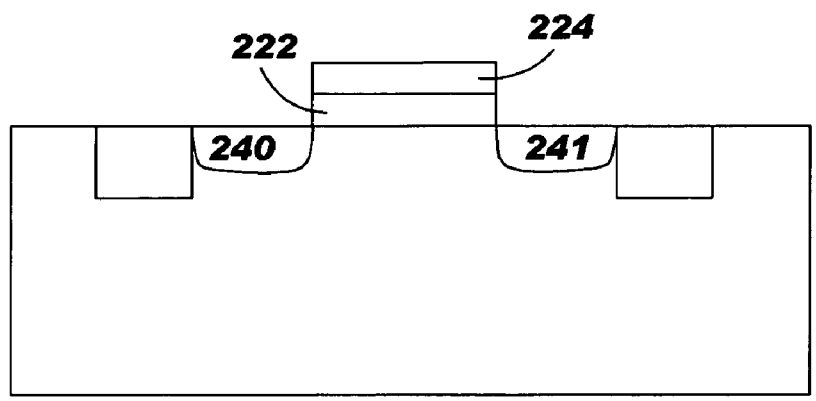

Next, as shown in FIG. 2(g), the source and drain regions 240 and 241 of the transistor are formed by subjecting the respective portions of the substrate to ion implantation, for example. Patterned photoresist layers (not shown), which are removed prior to the next stage of the process, are used to successively create the source/drain regions of the transistors. For the n-type transistors, a shallow and high-dose of arsenic ions, for example, may be used to form the source/drain regions 240 and 241 while the p-type transistors are covered with the corresponding photoresist layer. As discussed above, in the methods according to this invention, the source and drain regions 240 and 241 are formed in upper portions of semiconductor substrate 200 (i.e., not removed and reformed).

For the p-type transistors, a shallow and high dose of $BF_2$ ions, for example, may be used to form the source/drain regions 240 and 241 while the n-type transistors are covered with the corresponding photoresist layer. An anneal is then used to activate the implants. The exposed oxide on the structure is then stripped by dipping the structure in HF (hydrofluoric acid) in order to expose bare silicon in the source, gate and drain regions of the transistors.

Figure 2H:
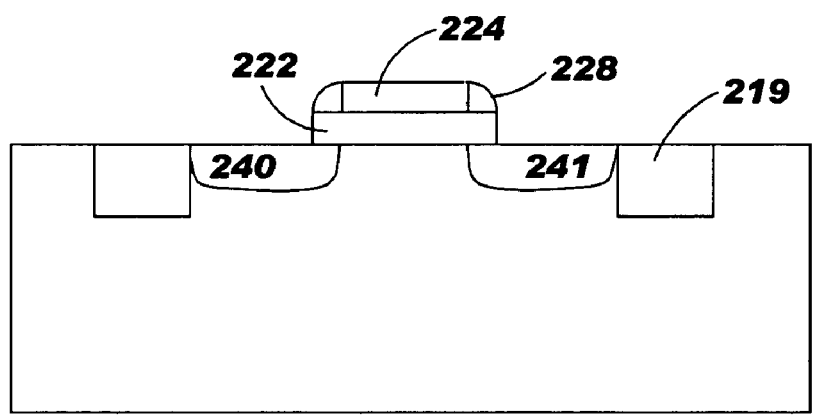

Further, as shown in FIG. 2(h), spacers 228 may be formed by depositing a silicon nitride layer (not shown) using CVD to a thickness of about 100 Angstoms to about 1000 Angstoms and then etching the nitride from the regions other than the sidewalls of the gate. The combination of the gate oxide layer 222, gate electrode 224 and spacers 228 may be referred to as a gate stack.

Figure 2I:
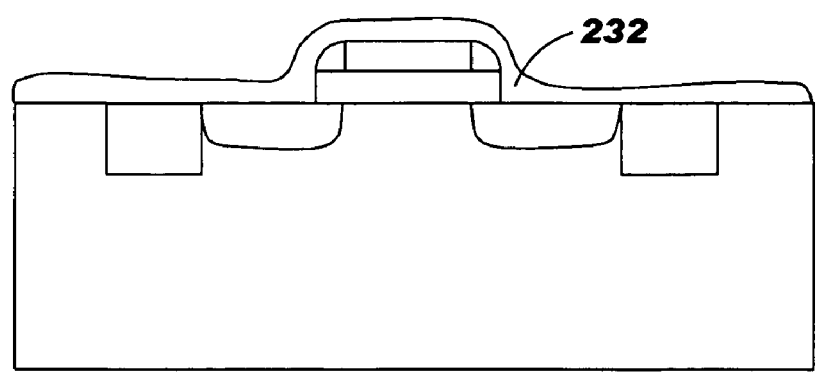
Figure 2J:
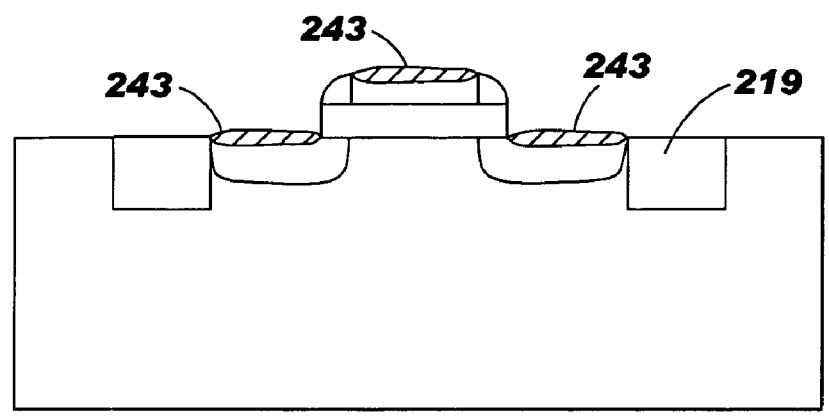

Referring to FIG. 2(i), metal 232 is deposited to a thickness of about 30 Angstroms to about 200 Angstroms across the wafer surface in order to form silicide 243. The silicide could be formed from reacting the underlying with any deposited metal such as Co, Hf, Mo, Ni, Pd2, Pt, Ta, Ti, W, and Zr. In the regions, such as, the source, drain and gate regions, where the deposited metal is in contact with silicon, the deposited metal reacts with the silicon to form silicide.

Next, the structure is heated to temperature of about 300° C. to about 1000° C. to allow the deposited silicide material to react with the exposed polysilicon or silicon. During sintering, silicide only forms in the regions where metal is in direct contact with silicon or polysilicon. In the other regions (i.e., where the deposited metal is not in contact with silicon), the deposited metal remains unchanged. This process aligns the silicide to the exposed silicon and is called "self-aligned silicide" or salicide. The unreacted metal is then removed using a wet etch while the formed silicide remains.

Figure 2K:
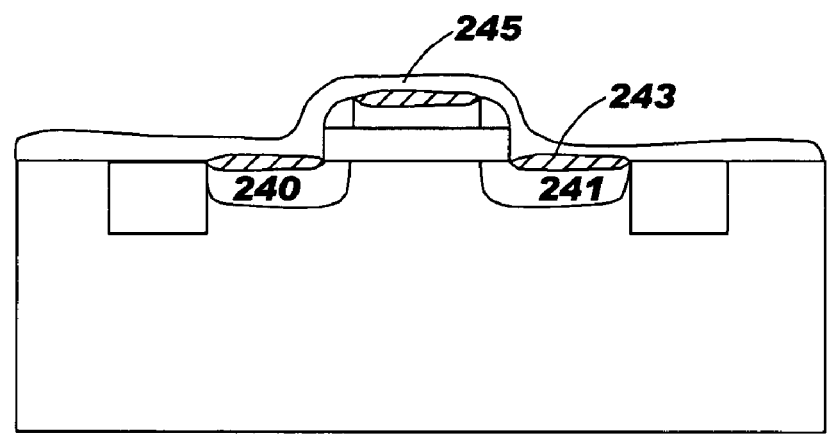

After salicidation is completed, in the methods according to this invention an etch stop nitride film 245 is deposited over the wafer, as shown in FIG. 2(k). The film may be of tensile stress or compressive stress. Depending on the topography of the shallow-trench-isolation oxide (STI) which surrounds and/or isolates one device from another device, the stress level induced in the transistor channel may be changed. Thus, by adjusting the thickness of the shallow-trench-isolation oxide which is adjacent to and/or isolates one device from the others (as shown in FIG. 2), it is possible to adjust the stress level in the corresponding transistor channel such that the desired stress type (i.e., compressive or tensile) is formed therein.

Figure 2L:
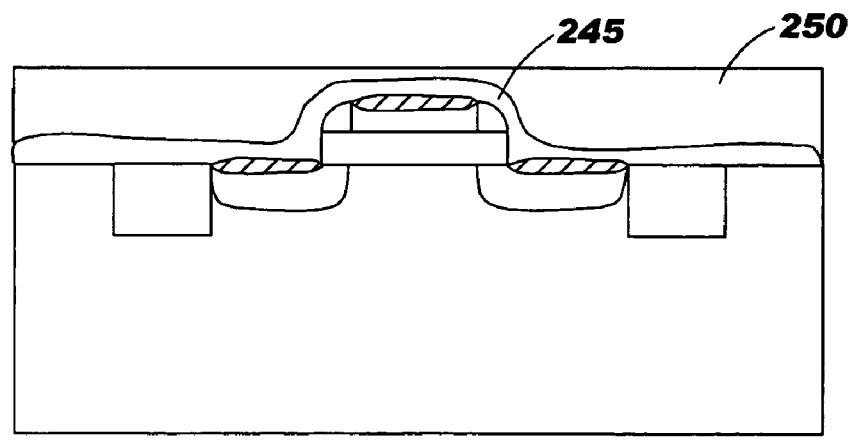

As shown in FIG. 2(l), after formation of the etch stop nitride layer an insulating layer 250 is formed thereon. The insulating layer may be, for example, boron-phospho silicate glass (BPSG). The insulating layer not only insulates one layer from another layer, as desired, the insulating layer may also serve be provided to planarize the surface of the device. The fabrication process continues as necessary according to the design specifications.

In the methods according to this invention because the source and drain regions of the semiconductor device are formed on portions of the semiconductor substrate which are undisturbed (i.e., not etched and re-formed), the surface is more favorable to cobalt silicide formation as cobalt silicide. Further, in the methods according to this invention, the thickness of the STI oxide of a transistor is adjusted and/or the distance of the STI oxide from the channel of the transistor is adjusted so as to control the amount and type of strain (i.e., compressive strain or tensile strain) created in the channel of the transistor. In particular, as further discussed below, by providing an STI oxide with a first thickness around the NFETs and providing an STI oxide with a second thickness around the PFETs (as shown in FIG. 2), a is possible to prevent the formation of the "undesired"(i.e., tensile stress in the PFET and compressive stress in the NFET) and even form the desired stress (i.e., compressive stress in the PFET and tensile stress in the NFET) with a same stress/strain layer for both the NFETs and the PFETs.

Figure 3:
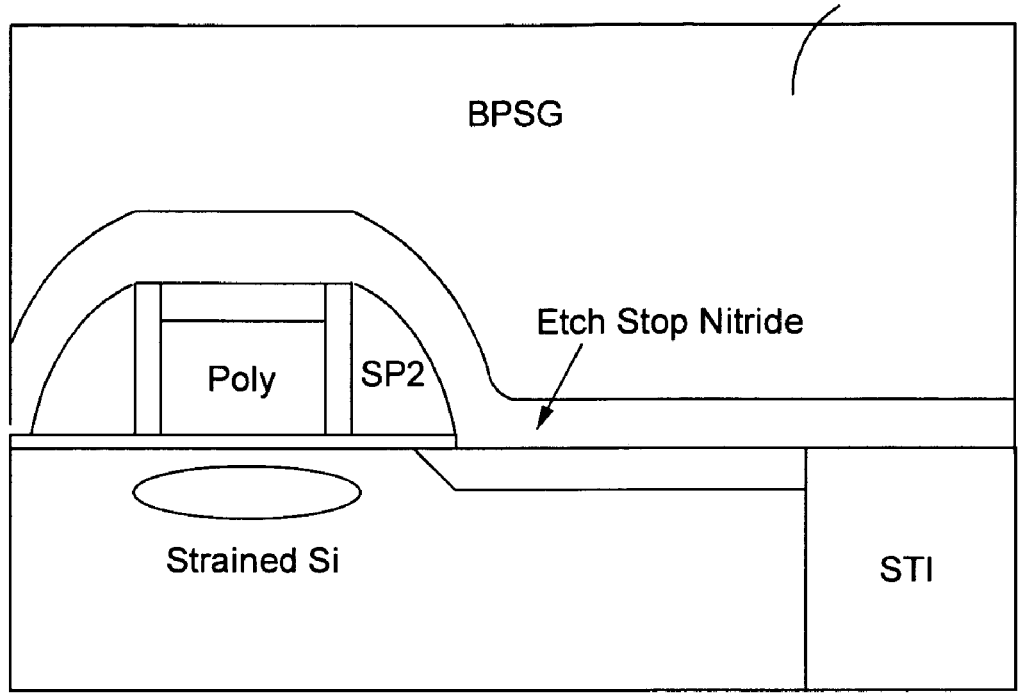
FIG. 3 illustrates an exemplary transistor having an STI oxide which is substantially planar with the silicon substrate.
Figure 4:
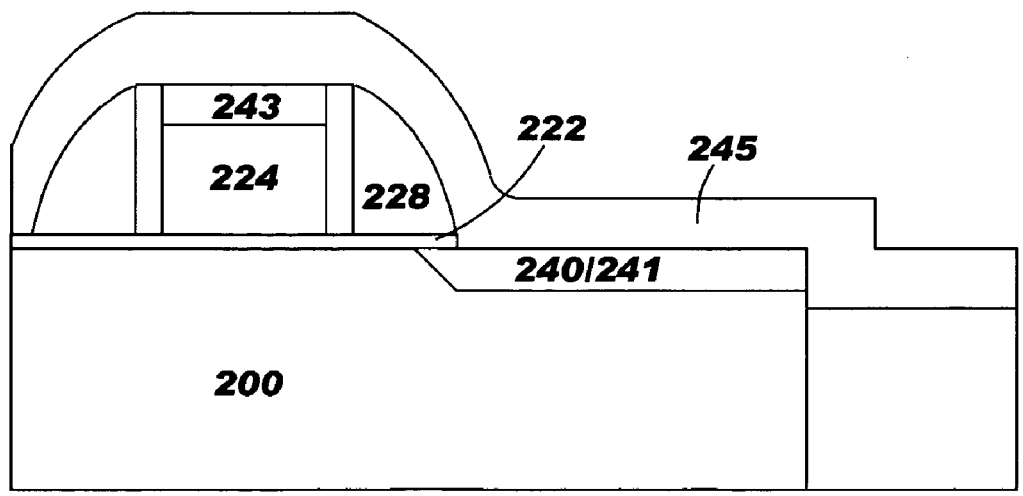
FIG. 4 illustrates an exemplary transistor having an STI oxide which has an upper surface which is lower than the upper surface of the silicon substrate.
Figure 5:
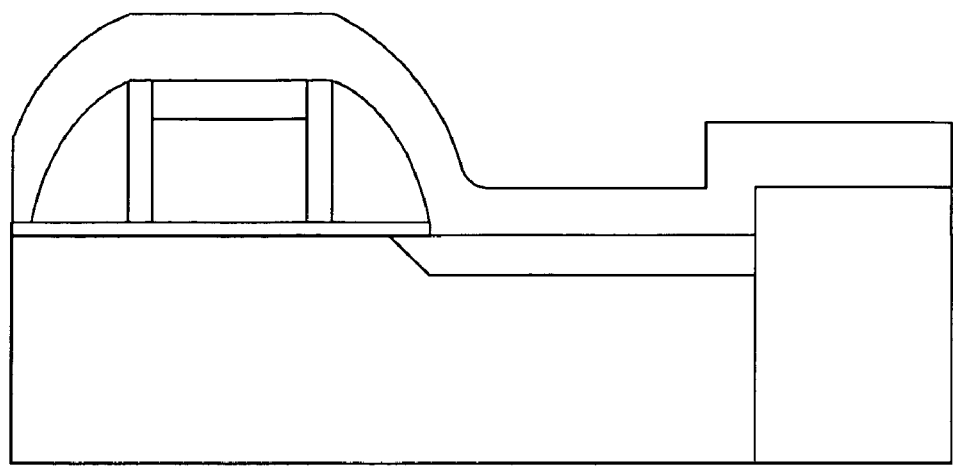
FIG. 5 illustrates an exemplary transistor having an STI oxide which has an upper surface which is higher than the upper surface of the silicon substrate.

FIG. 3 shows a cross-section of a transistor with a STI oxide which is substantially planar with the silicon substrate. FIG. 4 shows a cross-section of a transistor with a STI oxide which has a thickness which results in the upper surface of the STI oxide being lower than the upper surface of the silicon substrate. FIG. 5 shows a cross-section of a transistor with a STI oxide which has a thickness which results in the upper surface of the STI oxide being higher than the upper surface of the silicon substrate. Generally, when the upper surface of the STI oxide is lower than or higher than the upper surface of the silicon substrate, the STI oxide may be up to about 1000 Angstroms lower or higher than the upper surface of the silicon substrate.

Figure 6:
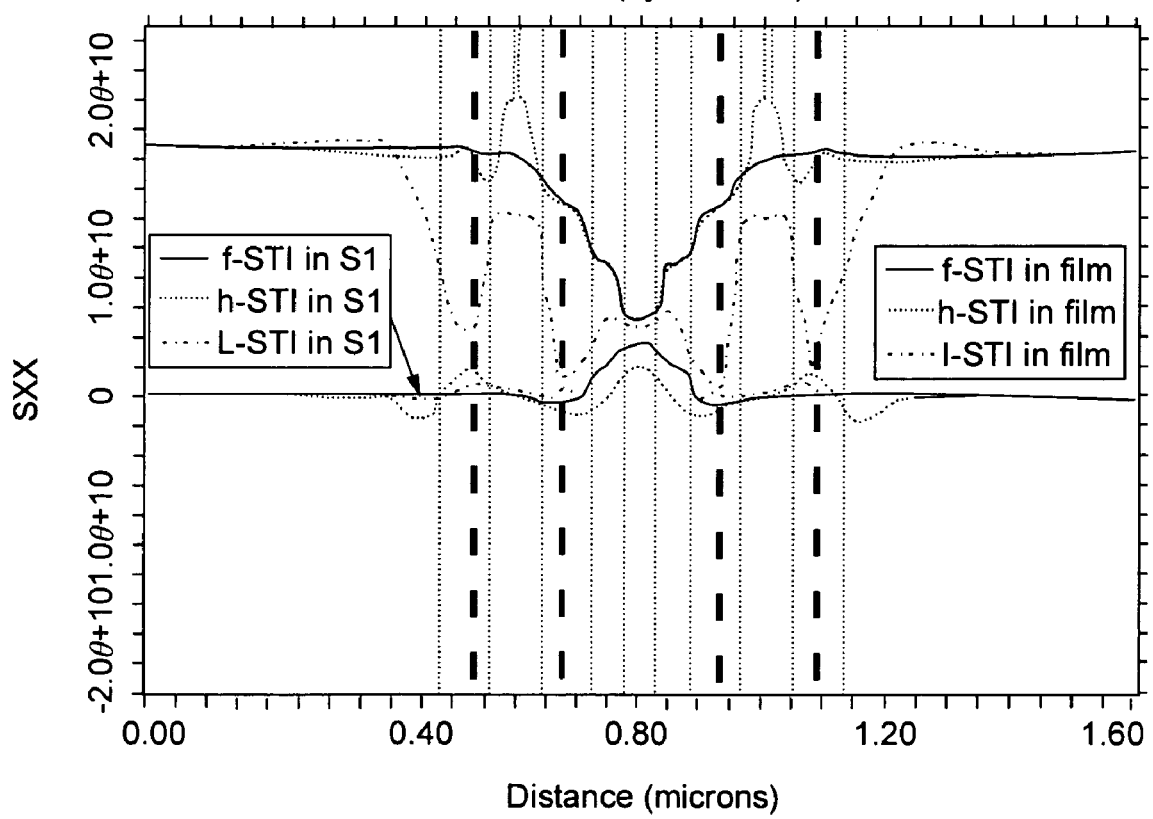
FIG. 6 is an exemplary simulation showing the stress in the transistor channel depending on the height of the STI oxide.

For example, depending on the type strain layer (i.e., tensile or compressive), either the NFETs or the PFETs may have such a structure while the other of the NFETs or the PFETs has an STI oxide which is lower than or higher than the silicon substrate. In another embodiment, one of the NFETs or the PFETs may have an STI oxide which is lower than the silicon substrate and the other of the NFETs or the PFETs may have an STI oxide which is higher than the silicon substrate. As shown in FIG. 6, with the same strain layer, the stress in the channel at about 100 Angstroms below the silicon surface varies with the thickness of the STI (i.e., whether the upper surface of the strain layer is lower than, substantially planar with or higher than the upper surface of the silicon substrate). In the simulation shown in FIG. 6, the stress in the transistor is shown when the upper surface of the STI oxide is 500 Angstroms below the upper surface of the silicon substrate, when the upper surface of the STI oxide is substantially planar with the upper surface of the silicon substrate, and when the upper surface of the STI oxide is 500 Angstroms higher than the upper surface of the silicon substrate. As can be seen from FIG. 6, which shows the effects when a tensile strain layer is used, when the upper surface of the STI oxide is 500 Angstroms below the upper surface of the silicon substrate, the tensile stress in the channel is higher than when the upper surface of the STI oxide is 500 Angstroms higher than the upper surface of the STI oxide.

Figure 7:
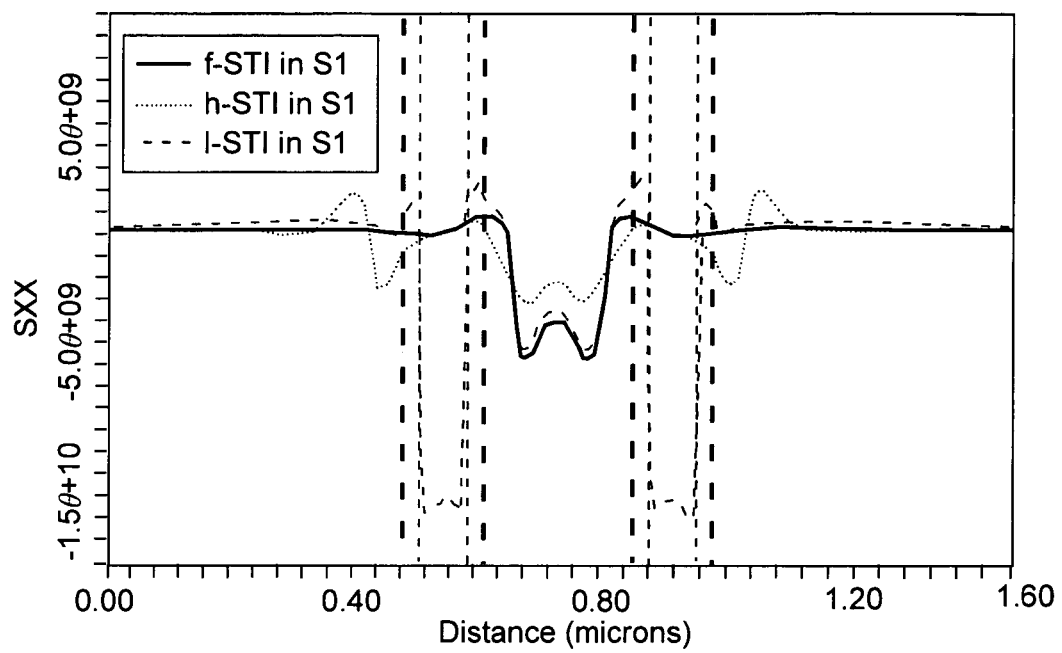
FIG. 7 is another exemplary simulation showing the stress in the transistor channel depending on the height of the STI oxide.

FIG. 7 shows a simulation showing compressive stress. In this case, when the upper surface of the STI oxide is 500 Angstroms higher than the upper surface of the silicon substrate, the compressive stress is reduced. In the simulation shown in FIG. 7, the STI oxide is about 1100 Angstroms from the gate of the transistor.

As shown above, generally, the stress in the channel is reduced when the upper surface of the STI oxide is higher than the upper surface of the silicon substrate. For this reason, when a tensile strain layer is used, the STI oxide of the PFET will generally have an STI oxide with a thickness which is greater than the thickness of the STI oxide of the NFET. However, the STI oxide of the PFETs and the NFETs may also have substantially the same thickness. In that case, depending on the desired amount of stress in the respective transistor channels, the STI oxide of the PFETs and the NFETs are generally formed such that the upper surface of the STI oxide of the PFETs are higher than the upper surface silicon substrate while the upper surface of the STI oxide of the NFETs are substantially planar to or lower than the upper surface of the silicon substrate.

Figure 8:
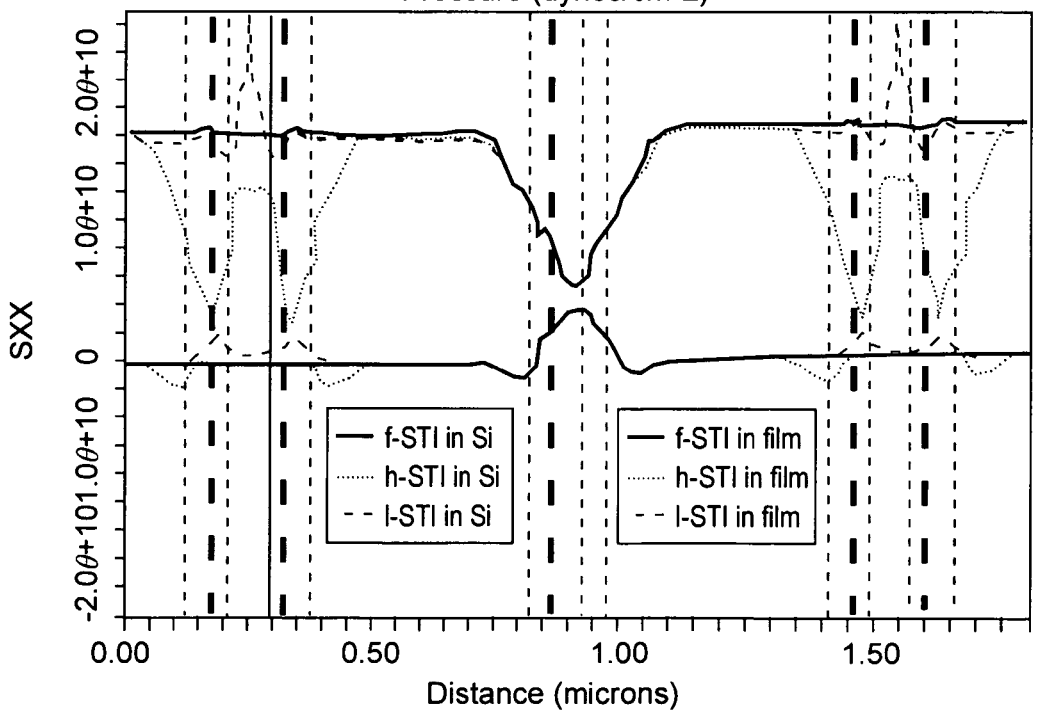
FIG. 8 is an exemplary simulation showing the stress level in the transistor channel when the STI oxide is far from the transistor gate.

Further, as discussed above, the stress formed in the transistor channel is dependent on the distance of the STI oxide from the corresponding transistor channel. As shown in FIG. 8, the stress level in the transistor may not be formed and/or affected when the STI oxide is far from the gate. Generally, the STI oxide is about 1500 Angstroms or less from the gate and, preferably, about 1100 Angstroms or less from the gate. As shown in FIG. 8, when the STI oxide is far from the gate, the stress level in the transistor channel is substantially the same regardless of whether the upper surface of the STI oxide is higher than, lower than or substantially planar with the upper surface of the silicon substrate.

As discussed above, in one embodiment of the invention, the upper surface of the STI oxide of one of the NFETs or the PFETs may be higher than the upper surface of the silicon substrate and the upper surface of the other of the NFETs or the PFETs may be below the upper surface of the silicon substrate. Thus, the thickness of the higher STI oxide may be about 300 Angstroms to about 1000 Angstroms greater than the thickness of the lower STI oxide.

The thickness of the strain layer may also contribute to the amount of stress/strain generated in the channel of the transistor. Generally, the stress/strain layer has a thickness of about 250 Angstroms to about 1500 Angstroms.

As discussed above with regards to FIG. 1, in PFETs, a longitudinal compressive stress is desired. The typical range for the desired compressive/tensile stresses is on the order of a few hundred MPa to a few GPa. For example, stresses of about 100 MPa to about 2 or 3 GPa are generally desired. The invention can produce very high compressive stresses and tensile stresses in the channels of the PFET and NFET devices, respectively.

By providing tensile stresses to the channel of the NFET and compressive stresses to the channel of the PFET the charge mobility along the channels of each device is enhanced. Thus, as described above, the invention provides a method for providing compressive stresses along the longitudinal direction of the channel of a PFET while providing tensile stresses in the channel of an NFET by providing, for example, a blanket strain layer on the semiconductor device. This invention also provides a method for optimizing the stress level in the transistor channel by adjusting the thickness of the shallow-trench-isolation oxide and/or adjusting the location of the shallow-trench-isolation oxide with respect to the channel of the corresponding transistor.

While the invention has been described in terms of embodiments, those skilled in the art will recognize that the invention can be practiced with modification within the spirit and scope of the appended claims.

The invention claimed is:

1. A method for manufacturing a device including an n-type device and a p-type device, comprising:
    forming a shallow-trench-isolation oxide (STI) isolating the n-type device from the p-type device;
    adjusting the shallow-trench-isolation oxide corresponding to at least one of the n-type device and the p-type device such that a thickness of the shallow-trench-isolation oxide adjacent to the n-type device is different from a thickness of the shallow-trench-isolation oxide adjacent to the p-type device; and
    forming a strain layer over a semiconductor substrate.

2. The method of claim 1, wherein the strain layer comprises an etch stop nitride film.

3. The method of claim 1, wherein the strain layer is one of a compressive strain layer or a tensile strain layer.

4. The method of claim 1, wherein the step of adjusting comprises forming a pad nitride with a first thickness for the n-type device and forming a pad nitride with a second thickness for the p-type device such that the first thickness is different from the second thickness.

5. The method of claim 4, wherein the first thickness is smaller than the second thickness.

6. The method of claim 4, wherein the first thickness is greater than the second thickness.

7. The method of claim 1, wherein the step of adjusting comprises covering the n-type device while exposing the semiconductor substrate to at least one oxide etching chemical, such that a thickness of the shallow-trench-isolation oxide adjacent to the n-type device is greater than the thickness of the shallow-trench-isolation oxide adjacent to the p-type device.

8. The method of claim 7, wherein the oxide etching chemical includes HF (hydrofluoric acid).

9. The method of claim 1, wherein the step of adjusting comprises covering the p-type device while exposing the n-type device and the semiconductor substrate to at least one oxide etching chemical, such that a thickness of the shallow-trench-isolation oxide adjacent to the p-type device is greater than the thickness of the shallow-trench-isolation oxide adjacent to the n-type device.

10. The method of claim 9, wherein the oxide etching chemical includes HF.

11. The method of claim 1, wherein the step of forming a strain layer comprises forming at least one of a SiGe, $Si_3N_4$, $SiO_2$ and $Sio_xN_y$ layer on the semiconductor substrate.

12. The method of claim 1, wherein the step of forming a shallow-trench-isolation oxide (STI) isolating the n-type device from the p-type device comprises forming the shallow-trench-isolation oxide at a distance of about 1500 Angstroms or less from the adjacent n-type device or p-type device.

13. The method of claim 1, wherein the thickness of the shallow-trench-isolation oxide of one of the n-type device or the p-type device is about 300 Angstroms to about 1000 Angstroms less than the shallow-trench-isolation oxide of the other of the n-type device or the p-type device.

14. A method for manufacturing a device including an n-type device and a p-type device, comprising:
    forming a boundary for the n-type device and the p-type device;
    adjusting a height of the boundary such that a boundary adjacent to the n-type device is at a level which is different from a level of a height of a boundary adjacent to the p-type device; and
    forming a strain layer over a semiconductor substrate.

15. The method of claim 14, wherein the strain layer comprises a compressive strain layer or a tensile strain layer.

16. The method of claim 15, wherein:
    the strain layer is a tensile strain layer, and
    the height of the boundary adjacent to the n-type device is lower than the height of the boundary adjacent to the p-type device.

17. The method of claim 16, wherein:
    the strain layer is a compressive strain layer, and
    the height of the boundary adjacent to the p-type device is lower than the height of the boundary adjacent to the n-type device.

18. A method for manufacturing a device including an n-type device and a p-type device, comprising:
    forming a shallow-trench-isolation oxide (STI) isolating the n-type device from the p-type device wherein a thickness of the shallow-trench-isolation oxide adjacent to the n-type device is different from a thickness of the shallow-trench-isolation oxide adjacent to the p-type device; and
    forming a strain layer over a semiconductor substrate.

* * * * *